United States Patent
Fujiwara

(10) Patent No.: US 9,277,675 B2
(45) Date of Patent: Mar. 1, 2016

(54) ELECTRONIC APPARATUS

(71) Applicant: KABUSHIKI KAISHA TOSHIBA, Minato-ku, Tokyo (JP)

(72) Inventor: Nobuto Fujiwara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 14/014,222

(22) Filed: Aug. 29, 2013

(65) Prior Publication Data
US 2014/0055953 A1 Feb. 27, 2014

Related U.S. Application Data

(63) Continuation of application No. PCT/JP2013/057933, filed on Mar. 13, 2013.

(30) Foreign Application Priority Data

Aug. 23, 2012 (JP) ................. 2012-184533

(51) Int. Cl.
*H02B 1/00* (2006.01)
*H02B 1/56* (2006.01)
(Continued)

(52) U.S. Cl.
CPC ............. *H05K 7/20336* (2013.01); *G06F 1/20* (2013.01); *G06F 1/203* (2013.01); *H05K 7/20* (2013.01); *H05K 7/2029* (2013.01); *H05K 7/20445* (2013.01); *F28D 15/00* (2013.01); *F28F 7/00* (2013.01); *G06F 2200/201* (2013.01)

(58) Field of Classification Search
CPC ... H05K 7/20; H05K 7/20336; H05K 7/2029; H05K 7/20445; F28F 7/00; F28D 15/00; F28D 15/02; G06F 1/20; G06F 1/203

USPC .............. 361/676–678, 679.46–679.54, 361/688–723, 752, 760, 762, 831; 165/104.1, 80.3, 185, 104.26, 104.33, 165/122; 257/706, 707, 722, 715; 174/15.2, 174/16.3

See application file for complete search history.

(56) References Cited

U.S. PATENT DOCUMENTS 5,818,693 A 10/1998 Garner et al.
6,352,103 B1 * 3/2002 Chu et al. ............... 165/80.3
(Continued)

FOREIGN PATENT DOCUMENTS

JP 03-247994 11/1991
JP 10-290088 10/1998
(Continued)

OTHER PUBLICATIONS

International Search Report and Written Opinion issued May 7, 2013 in connection with priority application No. PCT/JP2013/057933.

*Primary Examiner* — Courtney Smith
*Assistant Examiner* — Zhengfu Feng
(74) *Attorney, Agent, or Firm* — Knobbe, Martens, Olson & Bear, LLP

(57) ABSTRACT

According to one embodiment, an electronic apparatus includes a heating component, a housing, and a heat pipe. The housing accommodates the heating component and includes a wall. The wall includes a first region configured to receive heat from the component and a second region configured to have a lower temperature than a temperature of the first region. At least a portion of the heat pipe is buried in the wall from the first region to the second region.

8 Claims, 9 Drawing Sheets

(51) Int. Cl.
  *G06F 1/20* (2006.01)
  *H05K 5/00* (2006.01)
  *H05K 7/20* (2006.01)
  *F28F 7/00* (2006.01)
  *F28D 15/00* (2006.01)

(56) References Cited

U.S. PATENT DOCUMENTS

2008/0019093 A1 1/2008 Hongo
2009/0257193 A1* 10/2009 Ho .............................. 361/700
2012/0085520 A1 4/2012 Pfaffinger

FOREIGN PATENT DOCUMENTS

| | | |
|---|---|---|
| JP | 2000-022376 | 1/2000 |
| JP | 2000-094108 | 4/2000 |
| JP | 2002-344186 | 11/2002 |
| JP | 2003-218573 | 7/2003 |
| JP | 2006-074029 | 3/2006 |
| JP | 2010-211740 | 9/2010 |

* cited by examiner

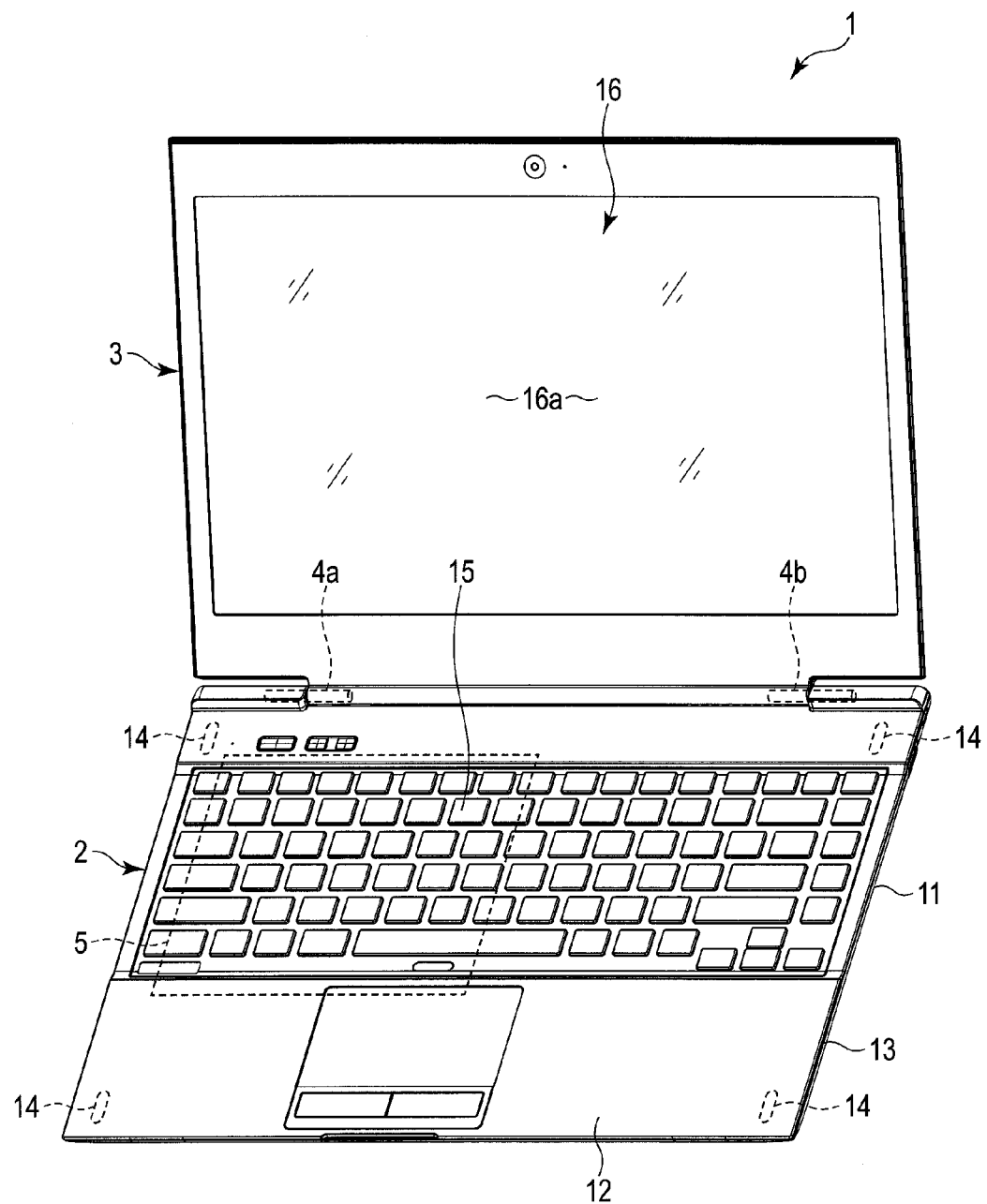
F I G. 1

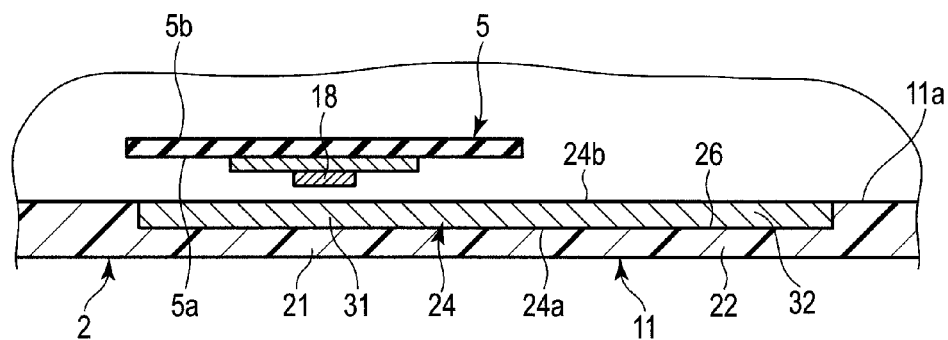
F I G. 2
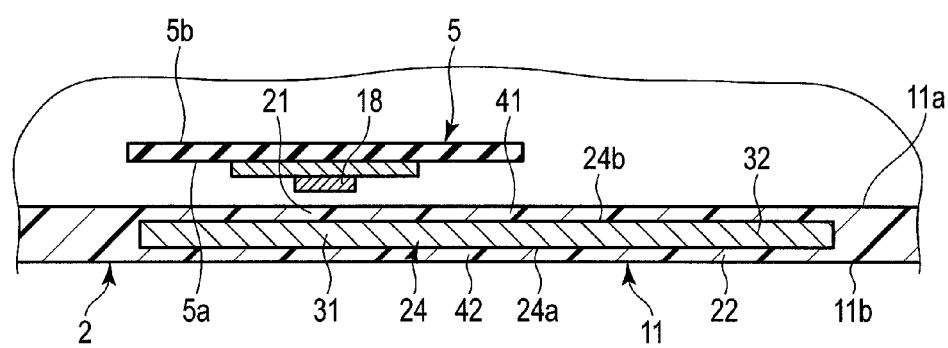
F I G. 3

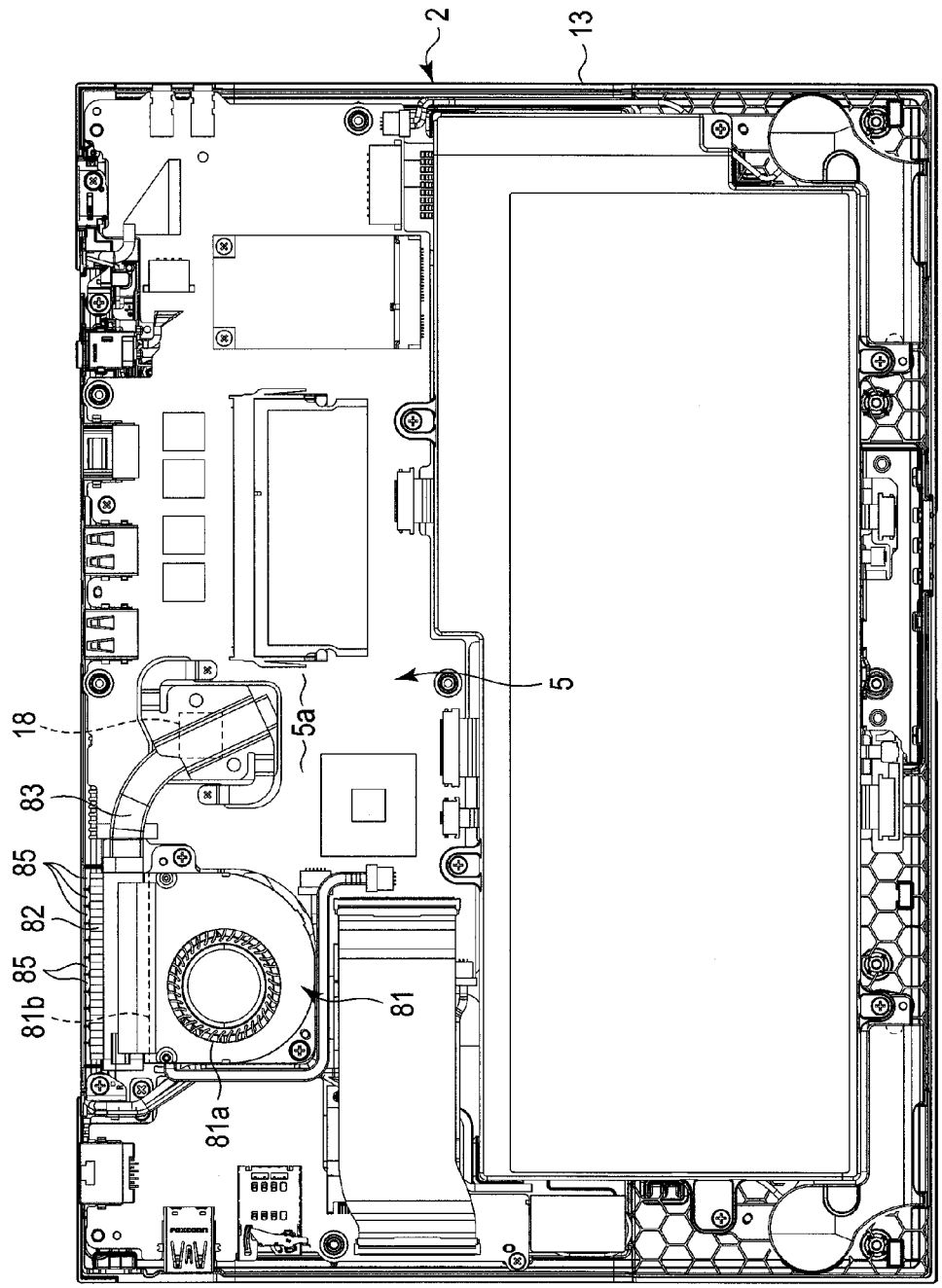
F I G. 8

ELECTRONIC APPARATUS

CROSS REFERENCE TO RELATED APPLICATIONS

This application is a Continuation Application of PCT Application No. PCT/JP2013/057933, filed Mar. 13, 2013 and based upon and claiming the benefit of priority from Japanese Patent Application No. 2012-184533, filed Aug. 23, 2012, the entire contents of all of which are incorporated herein by reference.

FIELD

Embodiments described herein relate generally to electronic apparatuses.

BACKGROUND

Some electronic apparatuses include a heating element, a heat sink, and a heat pipe that thermally connects the heating element and the heat sink.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary perspective view illustrating an electronic apparatus according to a first embodiment;

FIG. 2 is an exemplary cross-sectional view illustrating the electronic apparatus illustrated in FIG. 1;

FIG. 3 is an exemplary cross-sectional view illustrating an electronic apparatus according to a second embodiment;

FIG. 8 is an exemplary bottom view illustrating the internal structure of an electronic apparatus according to a sixth embodiment;

DETAILED DESCRIPTION

Figure 4:
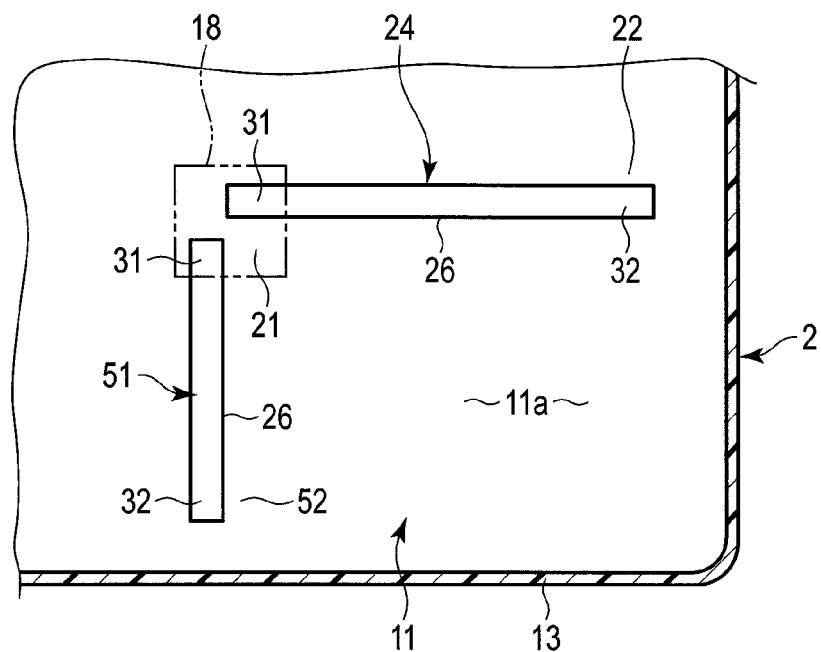
FIG. 4 is an exemplary cross-sectional view illustrating an electronic apparatus according to a third embodiment.

Various embodiments will be described hereinafter with reference to the accompanying drawings.

In general, according to one embodiment, an electronic apparatus comprises a heating component, a housing, and a heat pipe. The housing accommodates the heating component and comprises a wall. The wall comprises a first region configured to receive heat from the component and a second region configured to have a lower temperature than a temperature of the first region. At least a portion of the heat pipe is buried in the wall from the first region to the second region.

Herein, in some cases, some components are expressed by a plurality of terms. In this specification, some components are expressed by two or more terms. Those terms are just examples. Those components may be further expressed by another or other terms. And the other components which are not expressed by two or more terms may be expressed by another or other terms.

Hereinafter, embodiments will be described with reference to the accompanying drawings.

First Embodiment

First, an electronic apparatus 1 according to a first embodiment will be described with reference to FIGS. 1 and 2. As illustrated in FIG. 1, the electronic apparatus 1 according to this embodiment is a notebook portable computer. The electronic apparatus to which this embodiment and the following embodiments can be applied is not limited thereto. This embodiment and the following embodiments can be widely applied to various electronic apparatuses, such as tablet portable computers (i.e., tablet terminals or slate PCs), televisions, mobile phones (including smart phones), and game machines.

As illustrated in FIG. 1, the electronic apparatus 1 includes a first housing 2, a second housing 3, and hinges 4a and 4b. The first housing 2 is, for example, a main housing. A circuit board 5 is provided as a main board, for example, in the first housing 2. The first housing 2 includes a first wall 11 (e.g., a lower wall or a bottom wall), a second wall 12 (e.g., upper wall), and a third wall 13 (e.g., a circumferential wall or a side wall) and has a flat box shape. The first housing 2 is made of, for example, plastic, but the material forming the first housing 2 is not limited thereto. The first housing 2 may be made of, for example, a metal material.

The first wall 11 faces, for example, a desk surface (i.e., a mounting surface, an external surface, or an external mounting surface) when the electronic apparatus 1 is placed on a desk. The first wall 11 includes, for example, a plurality of leg portions 14 (i.e., supporting portions). The leg portions 14 come into contact with the desk surface to support the electronic apparatus 1 when the electronic apparatus 1 is placed on the desk.

The second wall 12 is opposite to the first wall 11. The second wall 12 extends substantially in parallel to, for example, the first wall 11. For example, an input unit 15 (i.e., an input receiving unit or an operation unit) is provided on the second wall 12. An example of the input unit 15 is a keyboard. The input unit 15 is not limited to the keyboard, but it may be, for example, a touch panel (i.e., touch sensor) or other input devices.

The third wall 13 extends in a direction intersecting (e.g., substantially perpendicular to) the first wall 11 and the second wall 12 and connects the edge of the first wall 11 and the edge of the second wall 12. The hinges 4a and 4b are connected to the rear end of the first housing 2. Herein, the front, rear, left, and right sides are defined, as viewed from the user. In addition, the side close to the user is defined as the "front side" and the side away from the user is defined as the "rear side".

The second housing 3 is, for example, a display housing. The second housing 3 includes a display 16 (i.e., a display device, a display module, or a unit). The display 16 includes a display screen 16a. An example of the display 16 is a liquid crystal display, but the display 16 is not limited thereto. The hinges 4a and 4b are connected to the lower end of the second housing 3.

The hinges 4a and 4b rotatably (i.e., openably) connect the first housing 2 and the second housing 3. In this way, the electronic apparatus 1 can be opened and closed (i.e., folded). The electronic apparatus 1 can be deformed between a first state in which the first housing 2 and the second housing 3 overlap each other and a second state in which the first housing 2 and the second housing 3 are opened. In the first state, the input unit 15 and the display screen 16a face each other and are hidden from the outside. In the second state, the input unit 15 and the display screen 16a are exposed to the outside.

As illustrated in FIG. 2, the circuit board 5 includes a first surface 5a and a second surface 5b. The first surface 5a is, for example, a lower surface and faces the first wall 11 of the first housing 2 (hereinafter, referred to as a housing 2). The second surface 5b is, for example, an upper surface and faces the second wall 12 (or the input unit 15) of the housing 2.

As illustrated in FIG. 2, a heating element 18 (i.e., a heating component, an electronic component, or a component) is mounted on the first surface 5a of the circuit board 5. The heating element 18 is, for example, a central processing unit (CPU) or a graphic chip, but is not limited thereto. The heating element 18 is an example of a "heating component (e.g., heat generating component)". The "heating component" may be, for example, a circuit board or a battery. Another example of the "heating component" is a heat sink. That is, the "heating component" is not limited to a component which generates heat, but may be a component which is heated by heat from a heat generating element.

The first wall 11 of the housing 2 includes a first region 21 (i.e., first portion) and a second region 22 (i.e., second portion). The first region 21 faces, for example, the heating element 18 and receives heat from the heating element 18. That is, the first region 21 receives heat transferred from the heating element 18. The first region 21 is an example of a high-temperature portion of the housing 2. The first region 21 may not face the heating element 18. The first region 21 may be a relatively high-temperature region of the housing 2.

For example, the second region 22 does not face the heating element 18. The second region 22 is further away from the heating element 18 than the first region 21 is. The second region 22 has a lower temperature than that of the first region 21. The second region 22 is an example of a low-temperature portion of the housing 2. The position or structure of the second region 22 is not particularly limited, but the second region 22 may be any region of the housing 2 with a relatively low temperature (i.e., temperature lower than that of the first region 21).

As illustrated in FIG. 2, the electronic apparatus 1 includes a heat pipe 24. The heat pipe 24 is provided such that at least a portion of the cross-section thereof is buried in the first wall 11 from the first region 21 to the second region 22 and. In this embodiment, the entire heat pipe 24 is buried in the first wall 11.

As illustrated in FIG. 2, the heat pipe 24 according to this embodiment is thin and has a thickness of, for example, 1 mm or less. The thickness of the heat pipe 24 is less than, for example, that of the first wall 11. Specifically, the thickness of the first wall 11 is, for example, 1 mm. The thickness of the heat pipe 24 is, for example, 0.5 mm.

In this embodiment, a groove 26 (i.e., a concave portion, a recess, or an accommodating portion) is provided in the inner surface 11a of the first wall 11. For example, the depth of the groove 26 corresponds to the thickness of the heat pipe 24 (i.e., the depth is substantially equal to the thickness of the heat pipe 24).

The heat pipe 24 is attached to the groove 26 (i.e., inserted into the groove 26). The heat pipe 24 is fixed to the groove 26 by, for example, a swage, an adhesive, or a double-sided tape. In this way, the heat pipe 24 and the first wall 11 are integrated with each other.

The heat pipe 24 includes a first surface 24a and a second surface 24b. The first surface 24a faces the bottom of the groove 26. The second surface 24b is opposite to the first surface 24a. The second surface 24b is a surface of the heat pipe exposed to the inside of the housing 2. In this embodiment, the second surface 24b is substantially flush with the inner surface 11a of the first wall 11. Therefore, the thickness of a heat pipe mounting portion is not more than the thickness of other regions of the first wall 11.

That is, in this embodiment, the entire heat pipe 24 (the entire cross-section in the thickness direction) is buried in the first wall 11 from the first region 21 to the second region 22. Alternatively, a portion of the heat pipe 24 may protrude from the groove 26.

The heat pipe 24 includes a first portion 31 and a second portion 32. The first portion 31 is, for example, a heat receiving portion and is provided in the first region 21. The first portion 31 is thermally connected to the first region 21. The heat of the first region 21 is transferred to the first portion 31. Heat transferred to the first portion 31 is moved to the second portion 32 by the action of the heat pipe 24.

The second portion 32 is, for example, a heat dissipation portion and is provided in the second region 22. The second portion 32 is thermally connected to the second region 22. The heat moved to the second portion 32 is transferred to the second region 22. Therefore, the heat of the first region 21 of the housing 2 is moved to the second region 22. In this way, heat is uniformly diffused in the housing 2 and it is possible to prevent a locally high-temperature generation from being formed in the first region 21.

The heat pipe 24 according to this embodiment extends, for example, in a straight line between the first portion 31 and the second portion 32. Since the heat pipe 24 is buried in the first wall 11, it can be provided in a straight line without being limited by other components in the housing 2. The heat transfer performance of the straight heat pipe 24 is higher than that of a curved heat pipe.

According to this structure, a locally high-temperature portion is less likely to be formed in the housing 2 and it is possible to improve the strength of the housing 2.

Specifically, in recent years, the thickness of electronic apparatuses has been reduced. In the thin electronic apparatus, a heating element provided in the housing is disposed close to the wall of the housing and heat generated from the heating element is likely to be transferred to the wall. Therefore, a locally high-temperature portion is likely to be formed in the housing of the electronic apparatus.

On the contrary, the electronic apparatus according to this embodiment includes the heating component (e.g., the heating element 18), the housing 2 including the component, and the heat pipe 24. The housing 2 includes the wall 11 including the first region 21 that receives heat generated from the component and the second region 22 with a lower temperature than that of the first region 21. At least a portion of the heat pipe 24 is buried in the wall 11 from the first region 21 to the second region 22.

That is, in this embodiment, the heat pipe 24 and the housing 2 are integrated with each other and the heat pipe 24 connects a portion of the housing 2 with a high temperature and a portion thereof with a low temperature. In this way, a portion of the heat of the first region 21 is diffused to the second region 22 by the heat pipe 24. As a result, it is possible to reduce the temperature of the first region 21. Therefore, heat is uniformly diffused in the housing 2 and a locally high-temperature portion is not formed in the housing 2.

The heat pipe 24 includes an outline of a metal material (for example, cooper) and has relatively high strength. Therefore, the housing 2 having the heat pipe 24 buried therein is reinforced by the heat pipe 24 and the strength thereof is improved.

In this embodiment, the groove 26 is provided in the inner surface 11a of the first wall 11. The heat pipe 24 is attached to the groove 26. According to this structure, it is possible to bury the heat pipe 24 in the first wall 11 with a relatively simple structure.

In this embodiment, the thickness of the heat pipe 24 is less than that of the first wall 11. According to this structure, it is possible to reduce the thickness of the electronic apparatus 1. In particular, in this embodiment, the groove 26 has a depth corresponding to the thickness of the heat pipe 24. The surface 24b of the heat pipe 24 is substantially flush with the inner surface 11a of the first wall 11. According to this structure, even when the heat pipe 24 is provided in the first wall 11, the internal space of the housing 2 is not narrowed. Therefore, it is possible to further reduce the thickness of the electronic apparatus 1.

Second Embodiment

Next, an electronic apparatus 1 according to a second embodiment will be described with reference to FIG. 3. In the second embodiment, components having the same or similar functions as those in the first embodiment are denoted by the same reference numerals and the description thereof will not be repeated. In addition, structures other than the following structures are the same as those in the first embodiment.

As illustrated in FIG. 3, in this embodiment, the entire heat pipe 24 is buried in a first wall 11. The heat pipe 24 is not exposed to the inside of a housing 2. The first wall 11 includes a first portion 41 that is disposed between an inner surface 11a of the first wall 11 and the heat pipe 24 and a second portion 42 that is disposed between an outer surface 11b of the first wall 11 and the heat pipe 24.

The heat pipe 24 is buried in the housing 2, for example, while the housing 2 is manufactured. That is, the housing 2 is molded while the heat pipe 24 is buried in the housing 2. In an example of a method of manufacturing the housing 2, for example, during casting or injection molding, the heat pipe 24 is set to a mold and molten metal or resin flows around the heat pipe 24. In this way, the heat pipe 24 is buried in the first wall 11.

According to this structure, similarly to the first embodiment, a locally high-temperature portion is less likely to be formed in the housing 2 and it is possible to improve the strength of the housing 2.

Third Embodiment

Next, an electronic apparatus 1 according to a third embodiment will be described with reference to FIG. 4. In the third embodiment, components having the same or similar functions as those in the first embodiment are denoted by the same reference numerals and the description thereof will not be repeated. In addition, structures other than the following structures are the same as those in the first embodiment.

As illustrated in FIG. 4, in this embodiment, the electronic apparatus 1 includes a plurality of heat pipes 24 and 51 (e.g., first and second heat pipes 24 and 51). Each of the first and second heat pipes 24 and 51 has the same structure and operation as the heat pipe 24 according to the first embodiment.

Specifically, a first wall 11 of a housing 2 includes a first region 21 (e.g., first portion), a second region 22 (e.g., second portion), and a third region 52 (e.g., third portion). The third region 52 has substantially the same function (i.e., operation) as the second region 22. That is, the third region 52 does not face, for example, a heating element 18. The third region 52 is further away from, for example, the heating element 18 than the first region 21 is. The third region 52 has a lower temperature than that of the first region 21. The third region 52 is an example of a low-temperature portion of the housing 2. The position or structure of the third region 52 is not particularly limited, but the third region 52 may be any region with a relatively low temperature (i.e., temperature lower than that of the first region 21) in the housing 2.

As illustrated in FIG. 4, the first heat pipe 24 is provided such that at least a portion of the cross-section thereof is buried in the first wall 11 from the first region 21 to the second region 22. The first heat pipe 24 moves the heat of the first region 21 to the second region 22.

On the contrary, the second heat pipe 51 is provided such that at least a portion of the cross-section thereof is buried in the first wall 11 from the first region 21 to the third region 52. The second heat pipe 51 moves the heat of the first region 21 to the third region 52.

According to this structure, similarly to the first embodiment, a locally high-temperature portion is less likely to be formed in the housing 2 and it is possible to improve the strength of the housing 2. In addition, according to this embodiment, the second heat pipe 51 moves the heat of the first region 21 to the third region 52. In this way, it is possible to uniformly diffuse heat in the housing 2.

Fourth Embodiment

Next, an electronic apparatus 1 according to a fourth embodiment will be described with reference to FIGS. 5 and 6. In the fourth embodiment, components having the same or similar functions as those in the first embodiment are denoted by the same reference numerals and the description thereof will not be repeated. In addition, structures other than the following structures are the same as those in the first embodiment.

Figure 5:
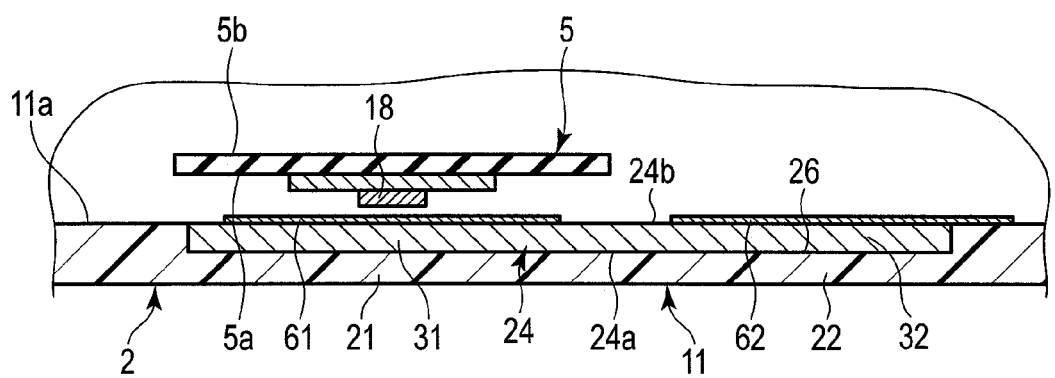
FIG. 5 is an exemplary cross-sectional view illustrating an electronic apparatus according to a fourth embodiment.

As illustrated in FIG. 5, in this embodiment, the electronic apparatus 1 includes first and second heat diffusers 61 and 62 (i.e., thermally-conductive members or heat transfer members). The first and second heat diffusers 61 and 62 are, for example, metal plates, metal sheets (e.g., copper laminated sheets or aluminum sheets), or graphite sheets, but are not limited thereto. The first and second heat diffusers 61 and 62 have a higher thermal conductivity than that of, for example, the housing 2.

Figure 6:
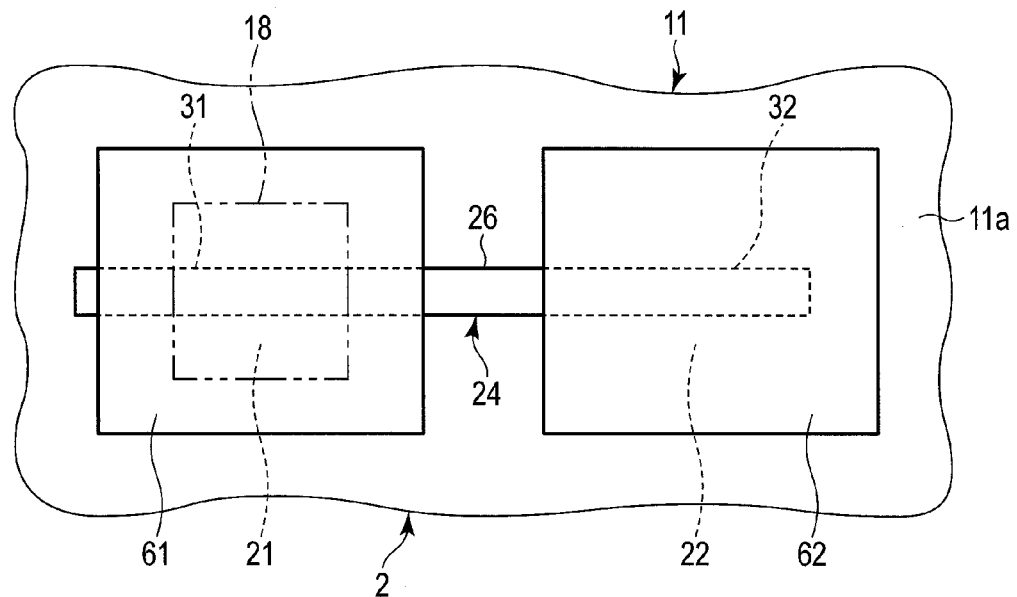
FIG. 6 is an exemplary plan view illustrating the internal structure of the electronic apparatus illustrated in FIG. 5.

As illustrated in FIGS. 5 and 6, the size of the first heat diffuser 61 is greater than the width of a heat pipe 24. The first heat diffuser 61 is attached to an inner surface 11a of a first wall 11 in a first region 21. The entire first heat diffuser 61 is thermally connected to the first wall 11. The first heat diffuser 61 may be thermally connected to the heat pipe 24 or it may not be thermally connected thereto.

As illustrated in FIG. 5, the first heat diffuser 61 is disposed between a heating element 18 and the heat pipe 24 and faces the heating element 18. The first heat diffuser 61 receives heat from the heating element 18. The first heat diffuser 61 transfers heat from the heating element 18 to the first wall 11 while the heat is diffused through the entire first heat diffuser 61. In this way, heat is transferred in the relatively wide range of the first wall 11. As a result, heat is uniformly diffused in the housing 2 and a locally high-temperature portion is less likely to be formed in the first wall 11.

As illustrated in FIGS. 5 and 6, the size of the second heat diffuser 62 is greater than the width of the heat pipe 24. The second heat diffuser 62 is attached to the inner surface 11a of the first wall 11 in the second region 22. The entire second heat diffuser 62 is thermally connected to the first wall 11. The second heat diffuser 62 is thermally connected to, for example, the heat pipe 24.

As illustrated in FIG. 5, the second heat diffuser 62 comes into contact with a second portion 32 of the heat pipe 24 and receives heat from the heat pipe 24. The second heat diffuser 62 transfers the heat from the heat pipe 24 to the first wall 11 while the heat is diffused through the entire second heat diffuser 62. In this way, heat is transferred in the relatively wide range of the first wall 11. In this way, heat is uniformly diffused in the housing 2 and a locally high-temperature portion is less likely to be formed in the first wall 11.

According to this structure, similarly to the first embodiment, a locally high-temperature portion is less likely to be formed in the housing 2 and it is possible to further improve the strength of the housing 2. In addition, in this embodiment, the first and second heat diffusers 61 and 62 are provided in the housing 2. According to this structure, heat is uniformly diffused in the housing 2 and a locally high-temperature portion is less likely to be formed in the first wall 11.

The first heat diffuser 61 and the second heat diffuser 62 may be integrated with each other. That is, one heat diffuser may be provided so as to extend from the first region 21 to the second region 22. Only one of the first heat diffuser 61 and the second heat diffuser 62 may be provided.

In this embodiment, the first heat diffuser 61 (i.e., thermally-conductive member) transfers heat from the heating element 18 to the first wall 11 while the heat is diffused through the entire first heat diffuser 61. The thermally-conductive member attached to the first wall 11 may be thermally connected to the first wall 11 and the heat pipe 24, instead of having the above-mentioned function. According to the thermally-conductive member, it is possible to transfer the heat of a portion of the first region 21 that is away from the heat pipe 24 to the heat pipe 24. In this way, it is possible to effectively move the heat of the first region 21 to the second region 22.

Fifth Embodiment

Next, an electronic apparatus 1 according to a fifth embodiment will be described with reference to FIG. 7. In the fifth embodiment, components having the same or similar functions as those in the first embodiment are denoted by the same reference numerals and the description thereof will not be repeated. In addition, structures other than the following structures are the same as those in the first embodiment.

Figure 7:
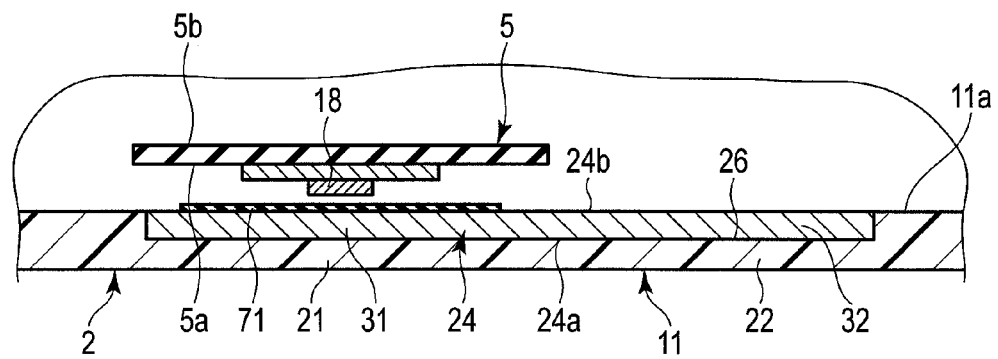
FIG. 7 is an exemplary cross-sectional view illustrating an electronic apparatus according to a fifth embodiment.

As illustrated in FIG. 7, the electronic apparatus 1 according to this embodiment includes a heat insulator 71. The heat insulator 71 is, for example, a heat insulating sheet, but is not limited thereto. The heat insulator 71 has, for example, a lower thermal conductivity than that of a housing 2.

The size of the heat insulator 71 is greater than the width of, for example, a heat pipe 24. The heat insulator 71 is attached to an inner surface 11a of a first wall 11 in a first region 21. The heat insulator 71 is disposed between a heating element 18 and the first wall 11. The heat insulator 71 reduces the amount of heat transferred from the heating element 18 to the first wall 11.

According to this structure, similarly to the first embodiment, a locally high-temperature portion is less likely to be formed in the housing 2 and it is possible to improve the strength of the housing 2. In this embodiment, the heat insulator 71 is provided in the housing 2. According to this structure, it is possible to reduce the amount of heat transferred from the heating element 18 to the first wall 11 and thus prevent a significant increase in the temperature of the first region 21. In this way, it is possible to uniformly diffuse heat in the housing 2.

Sixth Embodiment

Next, an electronic apparatus 1 according to a sixth embodiment will be described with reference to FIGS. 8 to 10. In the sixth embodiment, components having the same or similar functions as those in the first embodiment are denoted by the same reference numerals and the description thereof will not be repeated. In addition, structures other than the following structures are the same as those in the first embodiment.

FIG. 8 is a view illustrating the internal structure of a housing 2, as viewed from the lower side. The housing 2 includes a fan 81, a heat sink 82, and a heat pipe 83 (i.e., second heat pipe), in addition to the circuit board 5.

Specifically, exhaust holes 85 are provided in a third wall 13 (e.g., circumferential wall) of the housing 2. The fan 81 includes an inlet 81a and an outlet 81b. The inlet 81a is provided in each of the upper and lower surfaces of the fan 81 and is exposed to the inside of the housing 2. The outlet 81b is provided in the side surface of the fan 81 and faces the exhaust holes 85 of the housing 2. The fan 81 draws air in the housing 2 from the inlet 81a and discharges the drawn air from the outlet 81b toward the exhaust holes 85.

The heat sink 82 is disposed between the outlet 81b of the fan 81 and the exhaust holes 85 of the housing 2. The heat sink 82 is, for example, a fin unit including a plurality of fins. The heat sink 82 is cooled by air discharged from the outlet 81b of the fan 81. The heat pipe 83 extends between a heating element 18 and the heat sink 82. The heat pipe 83 is thermally connected to the heating element 18 and the heat sink 82. The heat pipe 83 moves the heat of the heating element 18 to the heat sink 82.

Figure 9:
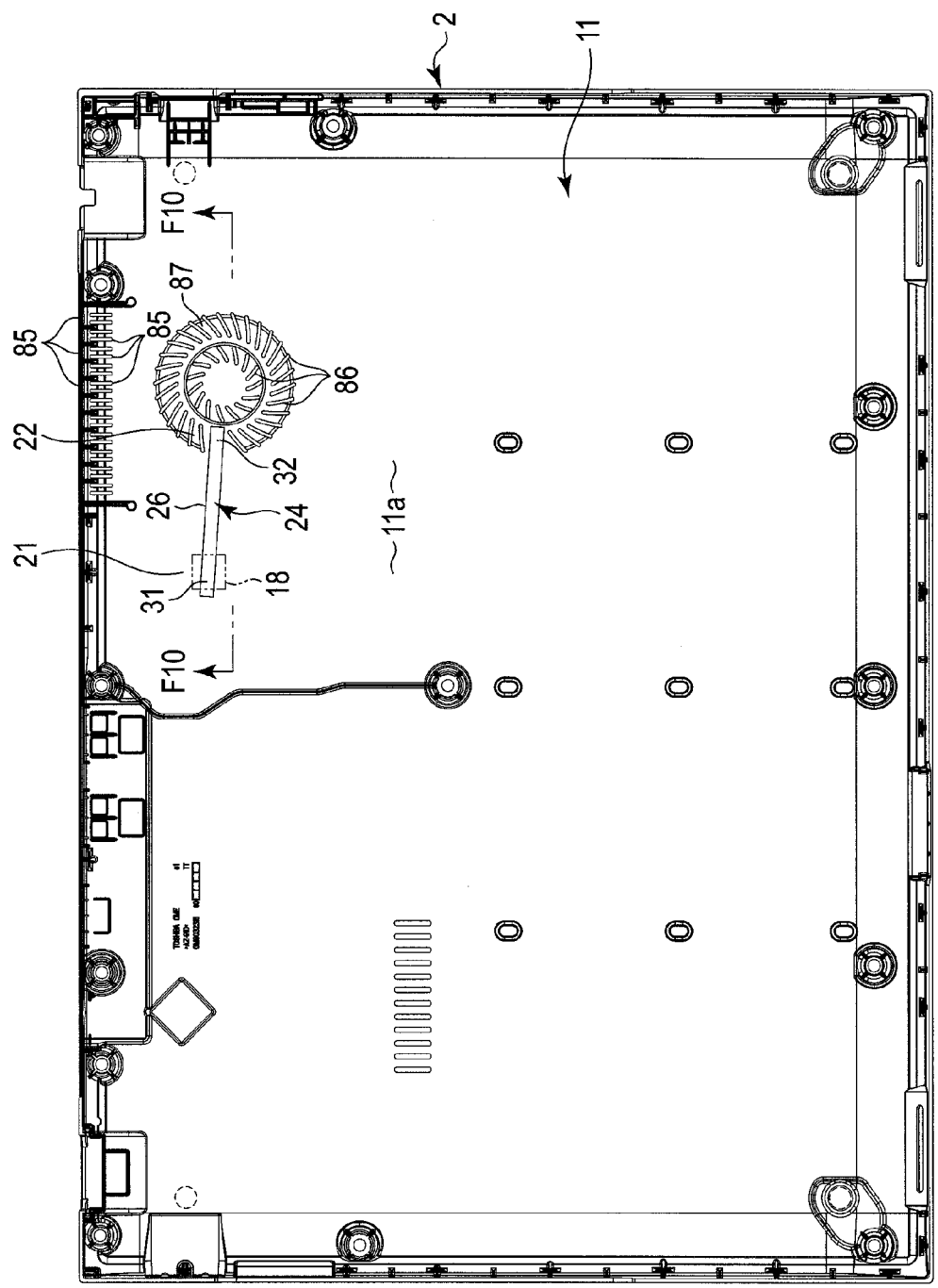
FIG. 9 is an exemplary plan view illustrating the inner surface of a lower wall of the electronic apparatus illustrated in FIG. 8.

FIG. 9 illustrates the inner surface 11a of the first wall 11 of the housing 2. In this embodiment, air intakes 86 (i.e., holes) are provided in the second region 22 of the first wall 11. The air intakes 86 are provided at a position corresponding to the fan 81 (e.g., immediately below the fan 81). In other words, in this embodiment, a region in which the air intakes 86 are provided functions as the second region 22.

When the fan 81 is driven, outside air is drawn from the air intakes 86 into the housing 2. That is, air flows to the fan 81 through the air intakes 86. When air flows to the air intakes 86, the second region 22 is cooled by the air. In this way, the temperature of the second region 22 is likely to be reduced.

Figure 10:
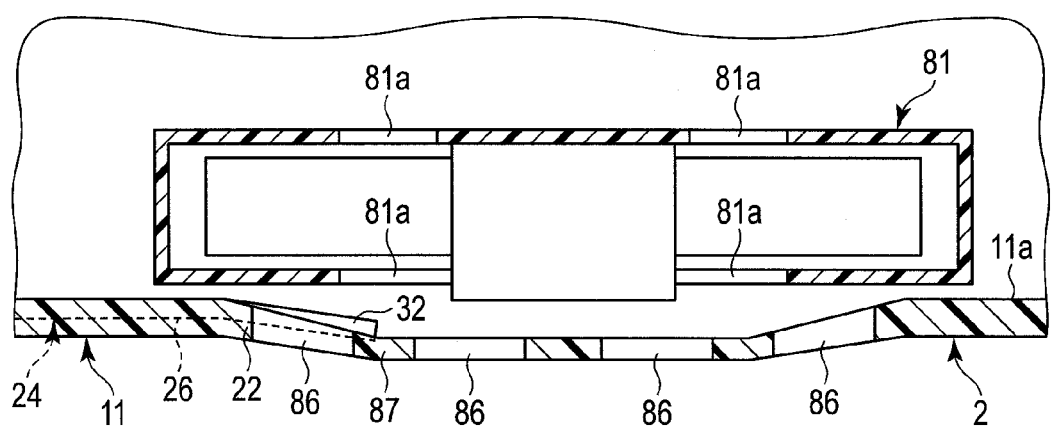
FIG. 10 is an exemplary cross-sectional view illustrating the electronic apparatus taken along the line F10-F10 of FIG. 9.

As illustrated in FIG. 10, the second region 22 includes a thin portion 87 at a position corresponding to the fan 81. The thin portion 87 protrudes toward the outside of the housing 2 in order to avoid the center of the fan 81 with a projection and is thinner than other regions. In addition, since some of a plurality of air intakes 86 are provided in the thin portion 87, the strength of the thin portion 87 is weak. However, in this embodiment, since the heat pipe 24 is provided in the second region 22, the thin portion 87 is reinforced by the heat pipe 24.

In this embodiment, a portion (e.g., end) of the heat pipe 24 is provided in the thin portion 87.

According to this structure, similarly to the first embodiment, a locally high-temperature portion is less likely to be formed in the housing 2 and it is possible to improve the strength of the housing 2. In addition, in this embodiment, the air intakes 86 through which air flows to the fan 81 are provided in the second regions 22 and the second regions 22 is cooled by the air. According to this structure, the temperature of the second region 22 is less likely to increase and it is possible to uniformly diffuse heat in the housing 2. Furthermore, in this embodiment, the periphery of the air intake 86 which is likely to have relatively weak strength is reinforced by the heat pipe 24. Therefore, it is possible to improve the strength of the housing 2.

Seventh Embodiment

Next, an electronic apparatus 1 according to a seventh embodiment will be described with reference to FIG. 11. In the seventh embodiment, components having the same or similar functions as those in the first embodiment are denoted by the same reference numerals and the description thereof will not be repeated. In addition, structures other than the following structures are the same as those in the first embodiment.

Figure 11:
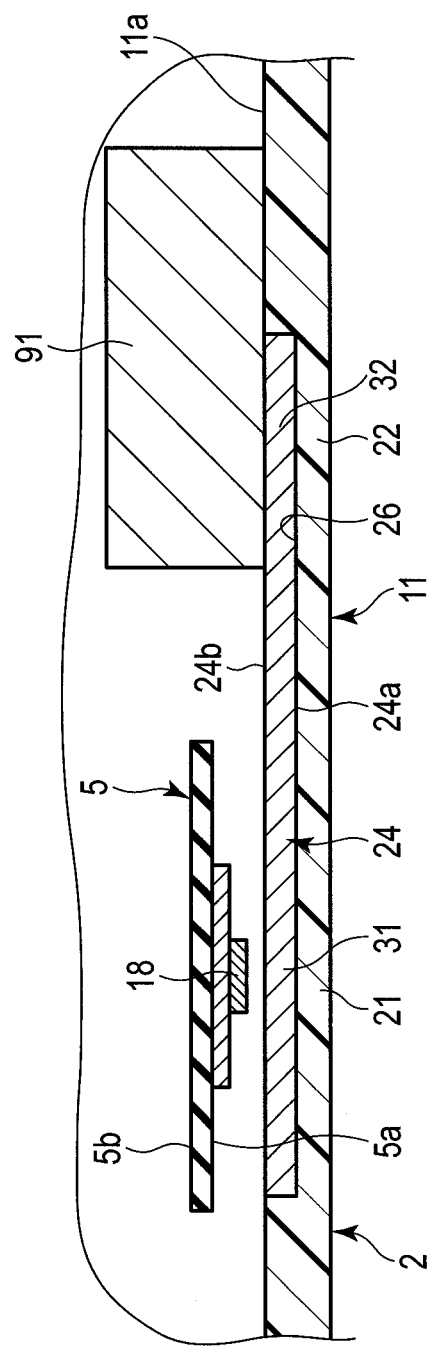
FIG. 11 is an exemplary cross-sectional view illustrating an electronic apparatus according to a seventh embodiment.

As illustrated in FIG. 11, a housing 2 includes a component 91. For example, the component 91 has relatively high heat capacity and the temperature thereof is less likely to increase. The component 91 is, for example, an ODD unit including a metal portion, but is not limited thereto.

The component 91 is provided in a second region 22 and is thermally connected to a first wall 11. In addition, the component 91 is directly thermally connected to a second portion 32 of a heat pipe 24. The heat pipe 24 moves a portion of the heat of the first region 21 to the component 91.

According to this structure, similarly to the first embodiment, a locally high-temperature portion is less likely to be formed in the housing 2 and it is possible to improve the strength of the housing 2. In addition, in this embodiment, the component 91 is thermally connected to the second portion 32 of the heat pipe 24. According to this structure, it is possible to further reduce the temperature of the first region 21 and uniformly diffuse heat in the housing 2.

Eighth Embodiment

Next, an electronic apparatus 1 according to an eighth embodiment will be described with reference to FIG. 12. In the eighth embodiment, components having the same or similar functions as those in the first and sixth embodiments are denoted by the same reference numerals and the description thereof will not be repeated. In addition, structures other than the following structures are the same as those in the first embodiment.

Figure 12:
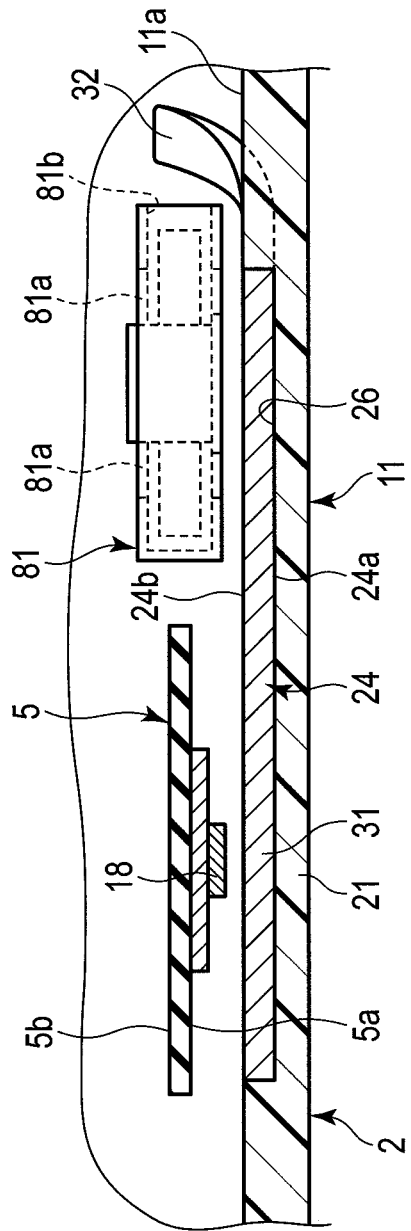
FIG. 12 is an exemplary cross-sectional view illustrating an electronic apparatus according to an eighth embodiment.

As illustrated in FIG. 12, a housing 2 includes a fan 81. In this embodiment, a second portion 32 of a heat pipe 24 protrudes from a first wall 11 to the inside of the housing 2. The second portion 32 of the heat pipe 24 faces an outlet 81b of the fan 81. The second portion 32 of the heat pipe 24 is cooled by air discharged from the fan 81.

According to this structure, a locally high-temperature portion is less likely to be formed in the housing 2 and it is possible to improve the strength of the housing 2. That is, in this embodiment, the electronic apparatus 1 includes a heating component (i.e., heating element 18), the housing 2, and the fan 81 provided in the housing 2, and the heat pipe 24. The housing 2 includes the component and the wall 11 which receives heat from the component. The heat pipe 24 includes a first portion 31 at least a portion of which is buried in the wall 11 and the second portion 32 that receives air from the fan 81.

According to this structure, the heat pipe 24 diffuses a portion of the heat of the first region 21 to reduce the temperature of the first region 21. Therefore, heat is uniformly diffused in the housing 2 and a locally high-temperature portion is less likely to be formed in the housing 2. In addition, the housing 2 having the heat pipe 24 buried therein is reinforced by the heat pipe 24 and the strength thereof is improved.

The embodiments are not limited to the above-described embodiments, but the components according to the above-described embodiments may be changed without departing from the scope and spirit of the invention. In addition, a plurality of components according to the above-described embodiments may be appropriately combined with each other to form various structures. For example, some of the components according to the above-described embodiments may be removed. Components according to different embodiments may be appropriately combined with each other.

For example, the wall in which the heat pipe 24 is provided is not limited to the first wall 11, but may be the second wall 12 or the third wall 13. In the above-described embodiments, the thickness of the heat pipe 24 is less than that of the wall of the housing 2, but the embodiments are not limited thereto.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a heating component;
a housing comprising a wall, the heating component in the housing, the wall comprising a first region that receives heat from the heating component and a second region that has a lower temperature than a temperature of the first region;
a heat pipe, at least a portion of the heat pipe in the wall between the first region and the second region; and
a heat insulator between the heating component and the first region.

2. The electronic apparatus of claim 1,
wherein an inner surface of the wall comprises a groove, and
at least a portion of the heat pipe is in the groove.

3. The electronic apparatus of claim 1,
wherein a transversal thickness of the heat pipe is less than a transversal thickness of the wall.

4. The electronic apparatus of claim 2,
wherein
a surface of the heat pipe is substantially flush with the inner surface of the wall.

5. The electronic apparatus of claim 1, further comprising:
a fan in the housing,
wherein the second region comprises a hole that directs air flow toward the fan for cooling the second region.

6. The electronic apparatus of claim 1, further comprising:
a heat diffuser having a greater transversal width than a transversal width of the heat pipe, the heat diffuser on an inner surface of the wall in the first region.

7. The electronic apparatus of claim 1, further comprising:
a heat diffuser having a greater transversal width than a transversal width of the heat pipe, the heat diffuser on an inner surface of the wall in the second region.

8. The electronic apparatus of claim 1,
wherein the heat pipe is inside the wall.

\* \* \* \* \*